Dec. 8, 1970 H. KNORRE ET AL 3,546,011

PROCESS FOR THE PRODUCTION OF ELECTRICITY CONDUCTING
SURFACES ON A NONCONDUCTING SUPPORT

Filed April 5, 1968

INVENTORS
Helmut Knorre
Eugen Meyer-Simon
Gottfried Kallrath
Hans Biegler

BY Stephens, Huettig and O'Connell
ATTORNEYS

United States Patent Office 3,546,011

Patented Dec. 8, 1970

3,546,011

PROCESS FOR THE PRODUCTION OF ELECTRICITY CONDUCTING SURFACES ON A NONCONDUCTING SUPPORT

Helmut Knorre, Hainstadt am Main, Eugen Meyer-Simon, Frankfurt, Gottfried Kallrath, Bruhl-Vochem, and Hanns Biegler, Wesseling, Germany, assignors to Deutsche Gold- und Silber-Scheideanstalt vormals Roessler, Frankfurt am Main, Germany Filed Apr. 5, 1968, Ser. No. 719,017
Claims priority, application Germany, Apr. 12, 1967, D 52,769
Int. Cl. B44d *1/18;* C23c *3/02*
U.S. Cl. 117—212 17 Claims

ABSTRACT OF THE DISCLOSURE

Electricity conducting surfaces and circuits are produced on insulation or nonconducting supports by preparing the support with a fine particle sized active filler which contains active groups for bonding ions of electricity conducting metals, roughening the surfaces of the thus filled support, adherently metallizing the roughened surface with an electricity conducting metal by means of a nonelectrolytic deposition of the metal whereby ions of the metal are chemically bonded to the active filler, and then, if desired, printing a circuit on portions of the metal coating.

BACKGROUND OF THE INVENTION

Field of the invention

The invention relates to the preparation of electricity conducting surfaces and printed circuits on insulating or nonconducting supports.

Description of the prior art

Up to the present time there has been used for the production of printed electrical circuits nonconducting supports which have been coated with copper on one or two sides thereof as the electricity conducting base for the printed circuits which are to be produced. The materials used as the nonconducting supports include, in particular, support plates made from phenolic and epoxy resins, and these plates are usually reinforced with paper or fiber glass. A film of copper, up to, at most 35 $\mu$m, is applied to the surface of the supports by a process employing an adhesive. Since, in producing the finished printed circuit, however, it is necessary on occasions to etch or corrode away up to 80% of the copper coating, this process is not economical and it also leads to technical errors and disadvantages, such as that of undercutting of the conducting circuit or, subsequently, relatively troublesome plating through holes.

According to another process, uncoated supports are used as the starting materials, and by means of a positive printing process the subsequent conducting circuit is printed on the support with a special lacquer. This lacquer contains copper-I-oxide, which is subsequently reduced and is then deposited as copper on the support in a chemical, nonelectrolytic process. The problems with this process consist in that, (a) the precision with which the conducting circuit is deposited on the support is limited by the screen printing process, (b) the required strength cannot be obtained, and (c) the intensification or thickening of the circuit path must be undertaken in a predominantly nonelectrolytic manner.

According to another known process, which represents a further development of the previously noted process, there has been proposed, as the support, a nonconducting material, which is superficially or thoroughly treated or mixed with copper-I-oxide. For the metallization of the support to form a printed circuit, the surface of the carrier is imprinted in a negative printing process with a protective layer whereby the path or route of the proposed printed circuit is kept free and is not coated with the protective layer. Then the copper-I-oxide in the exposed proposed circuit route is reduced to copper with an acid, such as, sulfuric acid, and onto this copper containing circuit more copper, or nickel, is deposited in a nonelectrolytic metallization bath, which depositions can then be further intensified galvanically.

The disadvantage of this process consists in that by reason of the fact that the entire surface of the support is subjected to an incursion of copper-I-oxide the electrical merits of the nonconducting carrier are unfavorably affected due to changes in the insulating properties of the support.

SUMMARY OF THE INVENTION

An object of the present invention is to provide a process whereby electricity conducting surfaces and circuits can be readily and economically provided on nonconducting supports.

Another object of the present invention is to provide such a process which can be conducted with a nonelectrolytic deposition on the supports of the electricity conducting surfaces and circuits.

The essence of the present invention resides in filling the nonconducting support with a fine particle sized active filler which contains active groups with which the metal employed in a subsequent metallization process can be bonded.

BRIEF DESCRIPTION OF THE DRAWINGS

The drawings illustrate the various steps in the process of the present invention.

DESCRIPTION OF THE PREFERRED EMBODIMENTS

Figure 1:
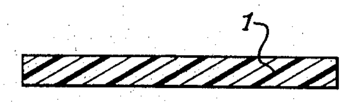
FIG. 1 shows a cross section of an untreated nonconducting support.

The invention relates to the problem of providing a process for the production of electricity conducting surfaces and tracks (conducting lines), particularly so-called printed circuits, on insulation or nonconducting supports by the adherent metallizing of the support by means of a nonelectrolytic deposition of an electrically conducting layer in a metallization bath, which bath consists of a predominantly aqueous reducing agent containing metal salt solution, in the presence of the metal deposition released metals, followed by a galvanic intensification of a portion or all of the conducting layer; by means of which the disadvantages of the prior art processes can be avoided, and adhering, and therefore very differentiated, metallic surfaces and conducting lines can be placed on nonconducting surfaces in an economical and technically simple manner.

The characteristic feature of the invention resides in the fact that the nonconducting support is prepared with a fine particle sized active filler before the support is treated in the metallization bath, and the roughness of the surface of the prepared support which may be necessary for the adherent anchoring thereto of the layer of conducting metal from the metallizing bath is effected by treating the support in a bath which will, preferably, corrode or etch the filler, so that on the thus corroded filler the metal nuclei which are necessary for the chemical metallization can be attached as metal ions on the particles of the filler embedded in the support from an activation bath containing such ions and the ions can be chemically combined to the filler particles, and then, the ions can be reduced to the elemental metal in a reducing agent containing preliminary bath.

The thus pretreated and prepared nonconducting support is then completely metallized in accordance with known procedures in a metallization bath which operates in a nonelectrolytic manner. For the production of so-called printed circuits, the thus obtained thin, electricity conducting metal layer is then, as is usually done in the known processes, printed with a coating of lacquer in a negative process which leaves uncoated the proposed circuit pattern, and the lacquer free circuit pattern is galvanically provided with an intensified coating of conducting metal, and after the galvanic intensification of the proposed circuit pattern the coating of lacquer is dissolved off the coated support in a bath of solvent and then the thus exposed, non-intensively coated thin metal layer is also removed from the support by means of a brief etching process.

The electricity conducting metals which are eventually deposited on the non-conducting support in elemental form include all those which have been used in the prior art processes for making electricity conducting surfaces and printed circuits and they include the metals: copper, tin, nickel, cobalt; the noble metals: silver, gold, and the metals of the platinum group.

The active fillers which are suitable for use in the process of the present invention include synthetic and natural fine particle sized oxides, silicates, carbonates, e.g., oxides of silicon, titanium and aluminum, alkali- and/or earthalkali- and/or alumosilicates and calciumcarbonate, which contain active groups, or in which active groups can be provided by a suitable pretreatment, such as an alkaline treatment. The active groups include all those to which the ions of the electricity conducting metal can be chemically bound until they are later reduced to elemental metal in a reducing process. Such active groups include OH, Si-H and SiOH.

Particularly advantageous as such fillers for use in the preparation of the non-conducting supports are fine particle sized, precipitated or pyrogenically produced metal and/or metalloid oxides in the form of individual oxides, mixed oxides or oxide mixtures. Included in the designation "precipitated fillers" are all those fillers which are produced by wet precipitation processes.

The pyrogenic fillers are produced from volatile metal or metalloid compounds by vapor phase hydrolysis or oxidation in a flame. In the flame hydrolysis a homogeneous mixture of, for example, a volatile metal or metalloid halide, such as, silicon tetrachloride in the vapor phase and a gas forming water on combustion and air or oxygen and, if desired, an inert gas is converted to the oxide and hydrochloric acid in a flame. When vaporized mixtures of several metal halides, such as, silicon tetrachloride and aluminum chloride are employed in place of a single halide so-called mixed oxides can be obtained in which each primary particle already consists of the oxides. The joint coagulation of separately prepared oxide aerosols gives unseparable oxide mixtures of the type of "co-coagulates." It, however, is also possible to employ mechanical mixtures of separately prepared oxide aerogels which are separable "mixtures of oxides." The individual oxide type used depends upon the synthetic resin to be metallized.

The fillers which may be used also include alkali metal and/or alkaline earth metal and/or aluminum silicates, as well as natural silicates, alumina and other natural fine particle sized minerals, which can be placed in an active state, for the purposes of the present invention, by a pretreatment, as for example, with hot caustic soda.

It is preferable to use, as the active filler, a material which has a secondary particle size of about 0.1 $\mu$m up to about 150 $\mu$m, and preferably about 1.0 up to about 20 $\mu$m, a primary particle size of about 2 up to about 100 m$\mu$, and preferably about 2 up to about 30 m$\mu$, and a BET surface area of about 20 up to about 800 m.$^2$/g. and preferably about 40 up to about 300 m.$^2$/g. The degree of roughness of the surface of the plastic of the nonconducting support may be indirectly regulatable by the particle size of the active filler. Especially suited are the finely divided wet precipitated silicas and silicates and pyrogenic silicas which can be essentially pure silicas or in the form of "mixed oxides" or co-coagulates of silica with, for instance, 0.5 to 1.5 wt. percent of $Al_2O_3$ which are commercially available as various grades of Aerosil which have BET surface areas ranging from about 60 to about 380 m.$^2$/g. Suitable finely divided precipitated silicas, for instance, are commercially available as Utrasil VN 2 and Ultrasil VN 3 (having other oxide contents below 1 wt. percent) as well as Durosil (having an $Na_2O$ content of about 2 wt. percent). Such precipitated silicas upon calcination suffer a weight loss of about 12%. Both the pyrogenic and the wet precipitated silicas employed according to the invention can be hydrophobized, for example, by treatment with methyl chlorosilanes to provide products containing about 1–3% of bound carbon. Suitable finely divided precipitated silicates, for instance, are the commercial product Calsil containing about 69–70 wt. percent of $SiO_2$ and about 10–11 wt. percent of CaO and calcium silicates DS53 and DS54 containing about 47 to 50 wt. percent of $SiO_2$ and about 34 to 35.5 wt. percent of CaO, as well as aluminum silicates P820 and Silteg As7 containing about 71–72 wt. percent of $SiO_2$ and about 8–9 wt. percent of $Al_2O_3$.

For bonding with the metal ions which are supplied in the activation bath fillers are used which preferably contain hydroxyl groups, for example, about 1 to about 10 wt. percent, so that the metal ions, such as Cu-ions or Pd-ions can be bonded to the active group containing fillers in an activation bath containing an ammoniacal solution of such ions. This bonding effect can be intensified by the use of fillers which are modified, e.g., with trichlorosilane ($HSiCl_3$).

Particularly suitable in this regard are silicas with Si-H bonds, which exhibit reducing properties. The loading with the activators is already clearly evident by reason of a more or less intense discoloration of the filler or the resin of the support. The resin for the support is prepared with, depending on the type of active filler and resin being used, about 5 to 60 wt. percent, and preferably of about 10 to 35 wt. percent of the active filler based on the weight of the resin.

By means of a suitable pretreatment of the support which has been filled with the active filler, and before the metallization process and the activation of the surface of the support with the necessary etching solution, the conditioning or roughening of the surface of the support which may be necessary for the adherent metallization of the support can also be simultaneously accomplished, in that, by means of a, for example alkaline, pretreatment of the support which has been treated with the active filler, the particles of the active filler lying at the surface of the support can be leached or dissolved out and thereby micropores can be formed in the support, in which pores the layer of conducting metal can then be anchored. In this case the bonding of the ions of the conducting metal, which ions are provided in the metallizing bath, can take place after the alkaline leaching pretreatment, and with active groups on the more deeply embedded active filler particles.

The support, which has thus been pretreated and then adherently provided with an electricity conducting layer of metal, can then, in contrast with most of the processes known to date, be imprinted in negative printing processes, and be further intensively coated with copper, galvanically, on the exposed conducting surfaces or circuits. The ultimate etching away of the portions of the base copper layer which are not further intensively coated with copper, galvanically, and which are only about 1 $\mu$m thick, is thus simpler and requires a shorter period of time. In addition, in contrast to the prior art processes, it is not necessary to provide the galvanically intensified conducting surfaces or circuits with an etching reserve, consisting of tin or tin-lead, since the loss, by etching, of only about 1 μm of copper from the intensively coated circuits or surfaces can be tolerated.

In this way, moreover, the conducting surfaces and circuits which are produced on supports can be made extremely thin, since, in view of the relatively very short etching time needed to remove the base copper coating, no danger of undercutting of the conducting surfaces or circuits is present. An additional important advantage is the fact that the support materials which are pretreated in accordance with the process of the present invention can be provided with pores before the chemical metallization process, wherewith the conductibility of the entire surface and of the pores of the support is made possible for the purposes of plating through hole during the passage of electricity through the circuit on the support.

A more detailed description of the steps in the process for the production of printed circuits is as follows:

(1) One or more of the raw support resins, such as phenolic resin, or epoxy resin, or plasticized phenolplast or cresylic-phenolplast resins, or other resins suitable for the production of the supports, are prepared, i.e., homogeneously admixed, with one or more of the active fillers, such as pyrogenic or wet precipitated silica, alumina or mixed oxides, and the admixture is molded into the desired shape of the support using any of the appropriate conventional molding procedures.

(2) The thus prepared support is then, if necessary, cleaned and/or degreased in conventional degreasing and/or cleaning baths.

(3) The degreased and cleaned support is then superficially conditioned in an etching bath of, for example, chromosulfuric acid and/or caustic soda, so as to dissolve out and/or etch particles of the active filler which are at or near the surface of the support, and thus provide a better means for anchoring the base coating metal thereto.

(4) The thus conditioned support is then activated in a bath of a salt of an electricity conducting metal, such as an ammoniacal $CuSO_4$ bath, or a bath of a salt of one of the other noble metals, for example, an ammoniacal $AgNO_3$ bath, or palladium chloride bath, and preferably an ammoniacal palladium chloride bath, whereby ions of the conducting metals are bonded to the reactive groups of the active filler, preferably, the composition of the activating bath is as follows: 2–4 g./l. metal or noble metal, and 15–20 ml./l. ammonia (25% b.w.).

(5) Then the thus treated support is then provided with the elemental metal conducting layer, in one of the commonly employed chemical metallization baths, which elemental layer is necessary for the subsequent galvanic intensification of the proposed circuit. This base layer is about 0.3 to 10 μm thick.

Metallization baths which may be used in this regard include those, for example, illustrated in Metalloberfläche, No. 8, pages B133–B138 (1965), and in Metal Finishing, Electroless Plating Today, Dr. Edward B. Saubestre, June 1962, pages 67–73, July 1962, pages 49–53, August 1962, pages 45–49 and September 1962, pages 59–63.

The supports which have been processed in this manner provide the electricity conducting base on which the electricity conducting printed circuits are to be subsequently placed in the known processes for galvanically intensifying, or building up, the deposition of conducting metal in the pattern needed for the intended circuit.

In contrast to the procedure followed by most of the previously known processes, all the areas of the surface of the thin base layer which are not to be eventually intensively coated with more conducting metal for the purposes of providing the desired circuit are now coated with a lacquer. After the lacquer is applied, the remaining exposed areas of the thin base layer, which exposed areas form a pattern for the proposed circuit, are then intensively coated with more of the conducting metal in a galvanic bath to provide the desired thickness for the path of metal that is to act as the circuit. The total thickness of the intensively coated metal path, including the thickness of the thin base metal layer is about 20 to 100 μm. After the intensification of the path of the circuit, the coating of lacquer is removed from the non-intensively coated areas of the support and the thus exposed areas of the thin base metal layer, which exposed areas are no longer desired, are removed from the surface of the support in a relatively short etching process in one of the known etching baths, i.e., ammonium peroxy disulfate. As indicated above, a small portion of the intensively printed circuit, up to about 2 μm thick, will also be etched away, but the advantages of the process of the present invention far outweight this disadvantage. Thus, the firmly adhering and intensively coated conducting circuit remains on the support, and it also exhibits no undercutting after the short etching process.

According to the process of the present invention, no sensitization with tin (II) chloride is necessary for the chemical metallization of the support. The omission of this sensitization procedure makes printed circuits produced by the process of the present invention notably advantageous, above all, in the plating through hole. Also, in subsequently carrying out the plating through hole the printed circuit can be activated immediately in a metal salt or noble metal salt bath after the boring of the contact holes through the support, and it can then be chemically metallized. An eventual deposition of nonconducting tin oxide hydrate on the conducting circuit is thereby avoided.

Figure 5:
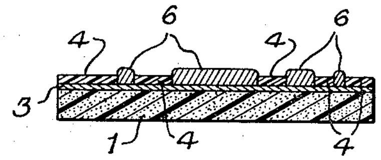
Figure 6:
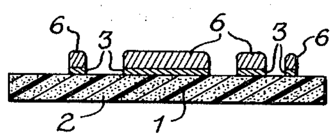
Figure 7:
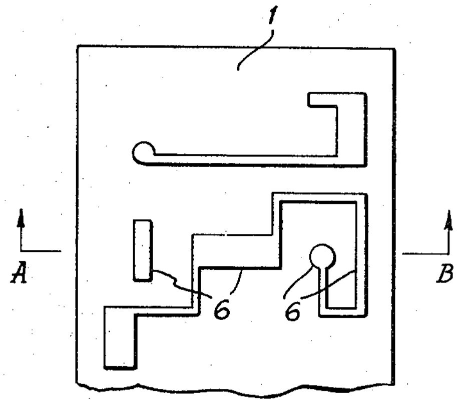
FIG. 7 shows a top view of the support shown in FIG. 6, which latter figure depicts the final product.

The drawings more clearly illustrate the various steps in the process of the present invention. FIGS. 1–6 show cross-sectional views of a support at successive steps in the process for placing a printed circuit on the support, and FIG. 7 shows a top view of the finished circuit.

Figure 4:
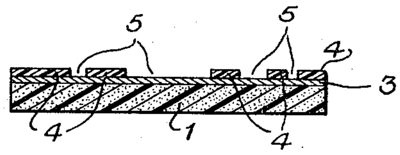
FIGS. 2 to 6 show cross sections of the support at the various stages, in succession, of the process of the present invention.
Figure 2:
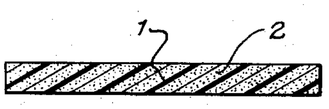
Figure 3:
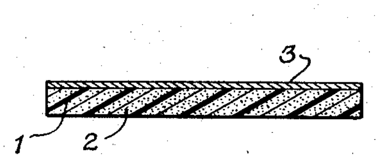

FIG. 1 thus shows an untreated plastic support 1 as would be used in the prior art. FIG. 2 shows a support 1 which has been treated or filled with particles of active filler 2, so that the fine particle sized active filler is homogenously dispersed throughout the support. FIG. 3 shows the filled support coated with a layer 3 of electricity conducting metal. FIG. 4 shows layer 3 which has been coated with lacquer 4 in a negative printing process which provides coatings of lacquer on areas of layer 3 which are not to be used as portions of the printed circuit and which leaves exposed those areas 5 of layer 3 which are to be used as portions of the printed circuit. FIG. 5 shows that the galvanically intensified coatings of conducting metal 6 have been applied to previously exposed areas 5 so as to provide the built-up layer of conducting metal needed for the printed circuit. The conducting metal used for layer 3 and the conducting metal used for layer 6 are usually the same, but these two layers are shown as separate entities in the drawings in order to facilitate the explanation of the invention. FIG. 6 shows a cross section of the finished plate with the printed circuit thereon, after lacquer 4 was removed, and then the areas of layer 3 which were under the lacquer were etched away. FIG. 7 shows a top view of the support with the printed circuit thereon which is shown in cross section in FIG. 6.

In the following examples there are disclosed advantageous and representative procedures for conducting the process of the present invention. These examples, however, are only illustrative of the process of the present invention and are not intended as a limitation upon the scope thereof.

EXAMPLE 1

Powdery phenolic resin based molding compositions were prepared by milling with the resin, in percent by weight, based on the weight of the resin, respectively, (a) 30% of precpitated silica having a primary particle size of about 10 to 20 m$\mu$, a secondary particle size of about 2 to 20 $\mu$m, and a BET surface area of 100 to 400 m.$^2$/g., and predominantly 240 m.$^2$/g., (b) 30% of a pyrogenically mixed oxide comprising about 98.3% $SiO_2$ and about 1.3% $Al_2O_3$, primary particle size of about 3 to 15 m$\mu$, secondary particle size of about 0.01 to 1 $\mu$m, BET surface area of 200 to 400 m.$^2$/g., (c) 30% of an aluminum silicate analyzing 72.0% $SiO_2$ and 8% $Al_2O_3$, and having a secondary particle size of 4 $\mu$m, a primary particle size of 35 m$\mu$ and a BET surface area of 110 m.$^2$/g., And then the milled masses were pressed into the shape of nonconducting supports using conventional molding procedures. The supports were then dipped into a hot, 50–60° C., bath of chromosulfuric acid on a rack for 15 to 30 minutes. The supports were then removed from the acid bath and activated by being rinsed for 5 to 10 minutes in an ammoniacal $AgNO_3$ solution (0.5 g. $AgNO_3$ liter). The supports were then placed in a conventional chemical metallization bath, at room temperature, and in about 15–30 minutes the supports were metallized with a layer of copper which was about 1–3 $\mu$m thick. The metallization bath had the following composition, per liter thereof, 7 grams $CuSO_4 \cdot 5H_2O$
34 grams sodium potassium tartrate
10 grams NaOH
6 grams $Na_2CO_3$
50 ml. formaldehyde
0.5 ml. wetting agent
0.01 g. stabilizer—thiourea, and
water to make each liter of the bath.

This electric current conducting copper layer was then coated with lacquer, by means of a photoprinting or screen printing process at the positions or areas on the surface of the support which are eventually not to form a part of the printed circuit. The thus prepared support was then intensively metallized in a galvanic bath at the places thereon which were uncoated with lacquer, that is, by the galvanic deposition of copper, and these areas were thus eventually coated with a noble metal layer which had a total thickness of about 1 $\mu$m including the thickness of the base copper layer that completely covered the surface of the support. Then the layer of lacquer was removed, and in an etching bath, i.e., in an aqueous solution of ammonium peroxy disulfate, the support was etched long enough to completely remove the thin base layer of copper from those areas of the surface of the support which had not been intensively coated with copper during the galvanic deposition step. The removal of metal from the conducting circuit was so trivial that no undercutting took place.

By this procedure it was thus possible to obtain fast adhering circuits on the supports, which correspond to the DIN (Deutsche Industrienorm) specifications for printed circuits.

EXAMPLE 2

Powdery epoxide resin was uniformly mixed with about 7% by weight, based on the weight of the resin, of a common inert filler, i.e., fiber glass, as well as with 30% by weight of active aluminum oxide which contained OH-groups.

The resulting admixture was then hot pressed into supports. The supports were then given a pretreatment on a rack for 15 to 30 minutes in an alkaline degreasing bath and then subjected for 5–30 minutes to 30% by weight, hot (60° C.) caustic soda in an etching operation. Then the supports were thoroughly rinsed with water and dipped for one minute in half concentrated HCl to neutralize the alkaline residues. The supports were then rinsed several times with hot water, then activated for 5–10 minutes in an ammoniacal palladium chloride solution (2 gr. $PdCl_2$/liter), and then coated on both sides thereof, with an electricity conducting cover layer, about 1$\mu$m thick, in a chemical metallization bath as described in Example 1. The application of the printed circuit to the base cover layer was then also accomplished as described in Example 1.

In another variation of the present invention, there can be used as the nonconducting support, a plate made of a conducting or nonconducting material, on which there is adherently placed the active filler filled synthetic resin support. Further treatment of such a composite support would then follow the procedures disclosed above, as in Examples 1 and 2.

In a still further variation of the process of the present invention. there can also be used, in place of the pulverulent admixtures of resin and active filler as disclosed above, solutions or dispersions, or brushable pastes of the admixtures as disclosed in the following examples.

EXAMPLE 3

145 grams of a heavily plasticized phenolplast (polyvinyl-butyral resin/phenolic resin in a 1:2 weight ratio—total resin content about 55–58%, and dissolved in a 1:1 to 2:1 by volume mixture of ethanol/toluene) were thoroughly mixed with 20 grams of a wet precipitated silica (having a specific surface area according to the BET measuring procedure of 200 m.$^2$/g., a primary particle size of 3–50 m$\mu$, and a secondary particle size of 3–10 $\mu$m) and then diluted with 200 ml. of a 1:1 by volume mixture of toluene and ethanol.

The active filler containing solution of the resin was deposited, using conventional techniques, on various substrates, such as webs or strips of paper, fiber glass and synthetic resin fibers such as nylon, as well as on mixtures of such fibers, and on preimpregnated support materials. The thus impregnated systems were dried, arranged in layers and then hot pressed at about 160° C. and about 300 kg./cm.$^2$ into the desired shape for the intended supports.

For the preparation of the thus produced supports for further treatment in accordance with the present invention, the supports were etched for 15 to 30 minutes at 60° C. in an aqueous chromosulfuric acid bath (containing about 10 g. $CrO_3$/liter, about 5 g. $Cr_2(SO_4)_3$/liter and 1,250 g. $H_2SO_4$/liter). The supports were then thoroughly rinsed with water and then steeped for 15 to 30 minutes in 30% by weight caustic soda at 60° C. The supports were then decontaminated after renewed rinsing in a 10% by weight aqueous solution of $NaHSO_3$, and further thoroughly rinsed in deionized water. The supports were then immediately activated in an aqueous ammoniacal $PdCl_2$ solution (containing 2 g. $PdCl_2$/liter and 10 ml. concentrated $NH_3$/liter), then rinsed in water, and in an aqueous reducing agent containing prebath (containing 5 ml. of a 30% by weight aqueous solution of formaldehyde/liter and 20 g. NaOH/liter). The palladium activator was developed thereon. The thus prepared and treated support was then provided with a fast adhering layer of copper metal which was 0.3 to 0.5 $\mu$m thick in a conventional, nonelectrolytically operating, aqueous metallization bath at a temperature of 20–40° C. The bath had the composition 34 g./l. Rochelle salts (K-Na-tartrate)
10 g./l. NaOH
7 g./l. $CuSO_4 \cdot 5H_2O$
6 g./l. $Na_2CO_3$
50 ml./l. formaldehyde (in the form of a 40% by weight aqueous solution).

For the eventual production of the printed circuits on the resulting support members, the surface areas of the supports on which the circuits were not to be present were first provided with a protective coating of lacquer before the galvanic intensification of the proposed circuit, then as described in Example 1, after the galvanic deposition of the printed circuit, the lacquer was dissolved off and the superfluous, exposed, thin base coating of copper was removed by etching, to leave only the printed circuit on the surface of the supports.

EXAMPLE 4

127 g. of an intensely modified cresylic-phenolplast system (comprising a 1:1 by weight mixture of cresylic-phenolplast and butadiene-acrylonitrile copolymer) were thoroughly mixed with 30 g. of wet precipitated aluminum silicate (analyzing 73% $SiO_2$, 7% $Al_2O_3$ and 7% $Na_2O$ and having a BET surface area of 70 $m.^2/g.$, a primary particle size of 20 to 40 mμ and a secondary particle size of 5–30 μm) and the resulting admixture was further mixed with 20 g. of dioctyl phthalate (plasticizer) and then diluted with 200 ml. of a 1:3 by volume mixture of toluene and ethanol. The supports were molded and dried as in Example 3.

The further preparation of the printed circuits was analogous to the procedure followed in Example 1. The activation bath employed was an aqueous ammoniacal $CuSO_4$ solution (containing 5 g. $CuSO_4\cdot 5H_2O$ per liter and 20 ml. concentrated $NH_3$/liter) and the aqueous prebath consisted of 2 g. $NaBH_4$/liter and 20 g. NaOH/liter.

For the nonelectrolytic metallization a bath was used as is described in Example 3.

The process of the present invention is not limited only to the production of printed circuits, but it can also be used in processes for the production of metallized plastic articles in which, after the metallization step, a galvanic intensification of the entire surface of the article, or only specific patterns provided on such surface, is undertaken, and such galvanic processes include those for the preparation of burnished or bright copper, bright silver and bright gold coated articles.

The active fillers used in the examples contained the following active groups and the amounts thereof:

GROUPS AND PERCENT BY WEIGHT THEREOF

| Active filler of Example: | |
|---|---|
| 1(a), $SiO_2$ | SiOH, 4–6 |
| 1(b), $SiO_2/Al_2O_3$ | SiOH, 1–2 |
| 1(c), $SiO_2/Al_2O_3$ | SiOH, 0.6–3 |
| 2, $Al_2O_3$ | AlOH, 0.7–15 |
| 3, $SiO_2$ | SiOH, 4–6 |
| 4, $SiO_2/Al_2O_3/Na_2O$ | SiOH, 4–6 |

The resins used to prepare the supports should be inert to any of the chemically reactive materials used in the process. In addition to the active fillers, the resins may also be filled or extended with similarly inert fillers and plasticizers, such as fiber glass, synthetic resin fibers, i.e., nylon.

Hydrocarbon solvents such as toluene, xylene and benzene, and oxygen containing solvents such as ethanol, methanol and isopropanol may be used to prepare the supports as disclosed in Examples 3 and 4.

These are the most powerful solvents.

The reducing agents which are used in the prebaths, i.e., the bath employed in Examples 3 and 4 before the metallization bath, include formaldehyde, sodium borohydride, hydrazine, hydroxyl amine, borozanes, hypophosphites and dithionites.

The reducing agents are used in the prebaths to develop the activators that have been previously applied to the support in the form of the ions of the activator metals bonded on the functional groups of the fillers, e.g., on the Si-OH-groups, to give Si-O-Me or Si-O-$Me^{II}$OH-compounds. During the reduction state in the prebath the metal ions are transferred into small metallic nuclei. These particles do not provide a continuous coating and for that reason they are no conductors of electric current.

We claim:

1. A process for applying an electrically conductive metal to the surface of a nonconductive support, the said process comprising the steps of (a) finely dispersing a filler compound selected from the group consisting of metal oxides, metaloid oxides, metal silicates, metal carbonates and mixtures of these compounds throughout a support material, the said filler compound being employed in an amount between 5 and 60% by weight relative to the support material and the said filler compound having in its molecule active, OH, SiH, or SiOH groups adapted to form a chemical bond with a metal ion;

(b) shaping the said support material so as to form a nonconductive support;

(c) roughening the surface of the support by subjecting it to a leaching or etching step to dissolve or etch out at least part of the said filler from the surface of the support and thus to form pores in the surface of the support;

(d) subjecting the support to a treatment in an ammoniacal solution containing metal ions whereby said ions are attached to said filler in said pores at or near the surface of the support; and (e) applying an electroless metallizing bath to the support so as to form a conductive metal coat thereon.

2. A process as in claim 1 in which said nonconducting support is laminated to a conducting or nonconducting plate.

3. A process as in claim 1 in which said filler comprises a least one member selected from the group consisting of metal oxides and metalloid oxides.

4. A process as in claim 1 in which said filler comprises at least one member selected from the group consisting of the silicates of alkali metals, alkaline earth metals and aluminum.

5. A process as in claim 1 in which said active filler has a primary particle size of about 2 to 100 mμ, a secondary particle size of about 3 to 20 μm and a BET surface area of about 20 to 800 $m.^2/g.$

6. A process as in claim 1 in which said pretreatment solution is an ammoniacal, aqueous noble metal salt solution.

7. A process as in claim 6 in which said salt is copper sulfate.

8. A process as in claim 1 in which the activated support is treated, prior to said metallizing bath, in a prebath which comprises a strong reducing agent in an aqueous alkaline solution thereof for the purposes of developing electricity conducting metal nuclei on the surface of said support.

9. A process as in claim 8 in which said strong reducing agent is selected from the group consisting of formaldehyde, sodium borohydride, hydrazine and hydroxyl amine.

10. A process as in claim 1 further comprising galvanically intensifying at least a portion of the coating of conducting metal.

11. A process as defined in claim 10 in which the galvanic intensification is applied to selected surface areas of said support.

12. A process as in claim 1 in which said nonconducting support comprises at least one synthetic resin adaptable for use in such support.

13. A process as in claim 12 in which said support comprises about 5 to about 60% by weight of filler, based on the weight of said resin.

14. A process as in claim 12 in which said nonconducting support further comprises at least one inert fibrous filler.

15. A process as in claim 14 in which said support is prepared from a composition comprising a solution of said resin and said filler, said composition being applied to an inert fibrous material, the resulting system then being dried and formed into said support.

16. The product of the process of claim 1.

17. The process of forming a printed circuit on the surface of a nonconductive support, the said process comprising steps of (a) finely dispersing a filler compound selected from the group consisting of metal oxides, metaloid oxides, metal silicates, metal carbonates and mixtures of these compounds throughout a support material, the said filler compound being employed in an amount between 5 and 60% by weight relative to the support material and the said filler compound having in its molecule active OH, SiH, or SiOH groups adapted to form a chemical bond with a metal ion;

(b) shaping the said support material so as to form a nonconductive support;

(c) roughening the surface of the support by subjecting it to a leaching or etching step to dissolve or etch out at least part of the said filler from the surface of the support and thus to form pores in the surface of the support;

(d) subjecting the support to a treatment in an ammoniacal solution containing metal ions whereby said ions are attached to said filler in said pores at or near the surface of the support;

(e) applying an electroless metallizing bath to the support so as to form a conductive metal coat thereon;

(f) forming a protective lacquer coating on surface areas of said metal coat which areas are intended not to be conductive;

(g) galvanically forming a reinforcing conductive metal coating on the unprotected areas of said first metal coating; and (h) removing the lacquer coating and underlying portions of the first metal coating thereby exposing the nonconductive support in such areas where the removal is effected while having the galvanically reinforced conductive metal coating in the areas where the latter has been applied.

References Cited

UNITED STATES PATENTS

| | | | |
|---|---|---|---|
| 2,454,610 | 11/1948 | Narcus | 117—35X |
| 2,690,401 | 9/1954 | Gutzert et al. | 117—160X |
| 3,146,125 | 8/1964 | Schneble et al. | 117—212 |
| 3,245,826 | 4/1966 | Luce et al. | 117—67 |
| 3,259,559 | 7/1966 | Schneble et al. | 117—212X |
| 3,269,861 | 8/1966 | Schneble et al. | 117—212 |
| 3,347,724 | 10/1967 | Schneble et al. | 117—47X |
| 3,370,974 | 2/1968 | Hepfer | 117—47 |

ALFRED L. LEAVITT, Primary Examiner

A. GRIMALDI, Assistant Examiner

U.S. Cl. X.R.

117—47, 160, 213, 227